(12) United States Patent
Hall et al.

(10) Patent No.: US 8,964,444 B2
(45) Date of Patent: Feb. 24, 2015

(54) ONE-TIME PROGRAMMABLE MEMORY, INTEGRATED CIRCUIT INCLUDING SAME, AND METHOD THEREFOR

(75) Inventors: Jefferson W. Hall, Chandler, AZ (US); Josef Halamik, Roznov P. R. (CZ); Pavel Londak, Hutisko Solanec (CZ)

(73) Assignee: Semiconductor Components Industries, LLC, Phoenix, AZ (US)

( * ) Notice: Subject to any disclaimer, the term of this patent is extended or adjusted under 35 U.S.C. 154(b) by 330 days.

(21) Appl. No.: 13/455,723

(22) Filed: Apr. 25, 2012

(65) Prior Publication Data
US 2013/0286710 A1    Oct. 31, 2013

(51) Int. Cl.
    *G11C 17/18*    (2006.01)
(52) U.S. Cl.
    USPC ........... 365/96; 365/103; 365/104; 365/225.7
(58) Field of Classification Search
    CPC ...... G11C 17/16; G11C 17/18; G11C 17/165; G11C 29/027
    USPC ................................. 365/96, 103, 104, 225.7
    See application file for complete search history.

(56) References Cited

U.S. PATENT DOCUMENTS

| | | |
|---|---|---|
| 5,708,291 A | 1/1998 | Bohr |
| 5,789,970 A | 8/1998 | Denham |
| 6,356,496 B1 | 3/2002 | Carroll |
| 6,624,499 B2 | 9/2003 | Kothandaraman |
| 7,009,443 B2 | 3/2006 | Illigems |
| 7,254,078 B1 | 8/2007 | Park |
| 7,321,501 B2 | 1/2008 | Chen |
| 7,474,551 B2 | 1/2009 | Chen |
| 7,881,093 B2 | 2/2011 | Domenicuccl |
| 2003/0123207 A1 | 7/2003 | Toyoshima |
| 2005/0052892 A1* | 3/2005 | Low et al. ........................ 365/94 |
| 2005/0189613 A1 | 9/2005 | Otsuka |
| 2005/0226078 A1* | 10/2005 | Ito et al. ................... 365/230.03 |
| 2006/0158239 A1 | 7/2006 | Bhushan |

OTHER PUBLICATIONS

Greve, David W., "Programming Mechanism of Polysilicon Resistor Fuses," IEEE J. of Solid-State Circuits, vol. SC-17, No. 2, Apr. 1982, pp. 349-354.
Alavi, Moshen et al., "PROM Element Based on Salicide Agglomeration of Poly Fuses in a CMOS Logic Process," IEEE IED 97, Jul. 1997, pp. 855-858.

(Continued)

*Primary Examiner* — Thao H Bui
(74) *Attorney, Agent, or Firm* — Polansky & Associates, P.L.L.C.; Paul J. Polansky (57) ABSTRACT

A one-time programmable memory includes a first one-time programmable memory cell including a fuse core having an input terminal for receiving a trim signal, an output terminal for providing a sense signal, and a fuse. The fuse core conducts current through the fuse in response to the trim signal. The one-time programmable memory cell also includes a sense circuit having an input terminal coupled to the output terminal of the fuse core, and an output terminal for providing a termination signal, and a logic circuit having a first input terminal for receiving a program enable signal, a second input terminal for receiving a data signal, a third input terminal coupled to the output terminal of the sense circuit for receiving the termination signal, and an output terminal coupled to the input terminal of the fuse core for providing the trim signal.

29 Claims, 8 Drawing Sheets

(56) References Cited

OTHER PUBLICATIONS

Kalnitsky, Alexander et al., "CoSi2 integrated fuses on polysilicon for low voltage 0.18um CMOS applications," IEEE IED 99, Sep. 1999, pp. 765-768.

Ang, Boon et al., "NiSi Polysilicon Fuse Reliability in 65-nm Logic CMOS Technology," IEEE Transactions on Device and Materials Reliability, vol. 7, No. 2, , Jun. 2007, pp. 298-303.

Suto, Hiroyuki et al., "Systematic Study of Dopant-Dependent Properties of Electrically Programmable Fuses with Silicided Poly-Si Links Through a Series of I-V Measurements," IEEE Transactions on Device and Materials Reliability, vol. 7, No. 2, , Jun. 2007, pp. 285-297.

Doorn, T.S., "A Detailed Qualitative Model for the Predictive Physics of Silicided Polysilicon Fuses," IEEE Transactions on Electron Devices, vol. 54, No. 12, Dec. 2007, pp. 3285-3291.

* cited by examiner

ONE-TIME PROGRAMMABLE MEMORY, INTEGRATED CIRCUIT INCLUDING SAME, AND METHOD THEREFOR

FIELD

This disclosure relates generally to one-time programmable memories, and more particularly, to programming circuits for one-time programmable memories.

BACKGROUND

One-time programmable (OTP) memories typically include a set of OTP memory cells. An OTP memory with cells based on fuses can be programmed by blowing selected ones of the set of fuses. One or more sense circuits are then able to read the combination of blown and intact fuses in the OTP memory in order to store a desirable data pattern. One application of a fuse-based OTP memory is to use the stored data pattern to select the optional functionality of an integrated circuit. In this way the same integrated circuit die can be used in a variety of applications. One example of an industry that makes use of OTP memories is the automotive industry.

Silicided polysilicon resistors are commonly used as fuses in submicron integrated semiconductor technologies. Fuses such as these are typically programmed by applying a fixed voltage across the fuse for a predefined period of time. The fixed applied voltage drives programming current through the fuse causing silicide migration within the fuse and resulting in an increased resistance relative to initial resistance. Because the characteristics of each fuse in the memory are different due to normal process variation, and because each memory cell is connected to external circuitry differently due to necessity, they respond differently to the programming stimuli. Therefore, the programming with fixed stimuli results in a relatively wide distribution of resistance after programming. In fact, if the programming time is too long, the programming of some OTP memory cells can fail causing the fuse to be erroneously read as intact. If the programming time is too short, the programming of some fuses can fail causing the same erroneous result. Thus, OTP memories often require multiple redundant OTP memory cells because incorrect programming of OTP memory cells can occur too frequently adding unnecessary cost to the device. More importantly, programming in this manner can lead to undesirable reliability issues. It is difficult to determine an acceptable, predefined programming time that accounts for all reasonable variation of process, voltage, and temperature.

BRIEF DESCRIPTION OF THE DRAWINGS

In the following description, the use of the same reference numerals in different drawings indicates similar or identical items.

DETAILED DESCRIPTION OF ILLUSTRATIVE EMBODIMENTS

Figure 1:
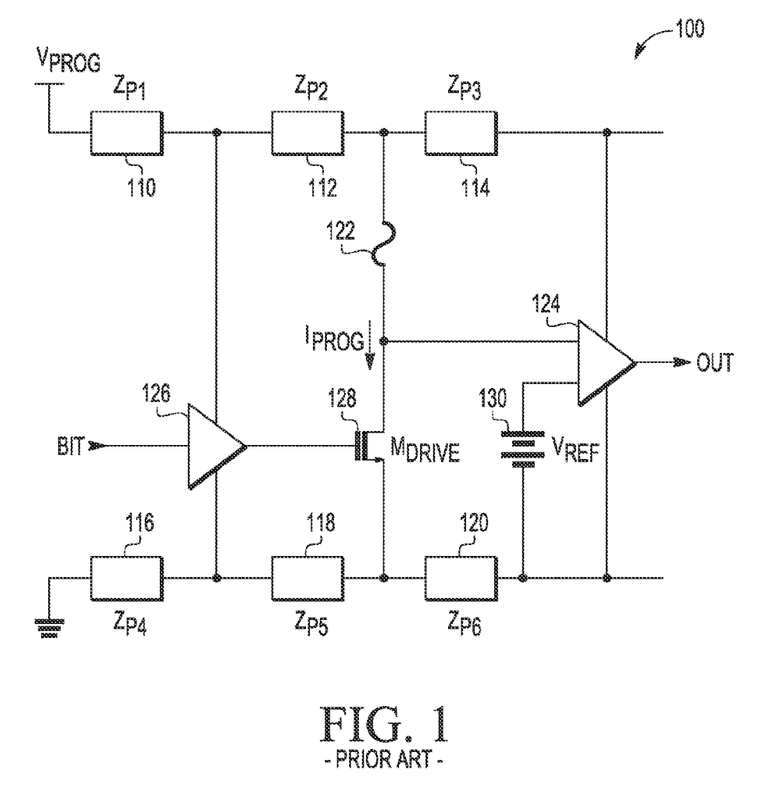
FIG. 1 illustrates, in partial block diagram and partial schematic form, a circuit for programming a fuse.

FIG. 1 illustrates in partial block diagram and partial schematic form a circuit 100 for programming a fuse. Circuit 100 includes generally parasitic impedance elements 110, 112, 114, 116, 118, and 120, a fuse 122, a sense amplifier 124, a driver 126, an N-channel metal oxide semiconductor (MOS) transistor 128, and a voltage source 130. Impedance element 110 has a first terminal connected to a power supply voltage terminal labeled "$V_{PROG}$", and a second terminal, and has an associated parasitic impedance labeled "$Z_{P1}$". Impedance element 112 has a first terminal connected to the second terminal of impedance element 110, and a second terminal, and has an associated parasitic impedance labeled "$Z_{P2}$". Impedance element 114 has a first terminal connected to the second terminal of impedance element 112, and a second terminal, and has an associated parasitic impedance labeled "$Z_{P3}$". Impedance element 116 has a first terminal connected to ground having a nominal voltage of 0.0 volts, and a second terminal, and has an associated parasitic impedance labeled "$Z_{P4}$". Impedance element 118 has a first terminal connected to the second terminal of impedance element 116, and a second terminal, and has an associated parasitic impedance labeled "$Z_{P5}$". Impedance element 120 has a first terminal connected to the second terminal of impedance element 118, and a second terminal, and has an associated parasitic impedance labeled "$Z_{P6}$".

Fuse 122 has a first terminal connected to the second terminal of impedance element 112, and a second terminal. Sense amplifier 124 has a first input terminal connected to the second terminal of fuse 122, a second input terminal, a positive power supply input terminal connected to the second terminal of impedance element 114, a negative power supply input terminal connected to the second terminal of impedance element 120, and an output terminal for providing a signal labeled "OUT".

Driver 126 has an input terminal for receiving an input signal labeled "BIT", a positive power supply input terminal connected to the second terminal of impedance element 110, a negative power supply input terminal connected to the second terminal of impedance element 116, and an output terminal. Transistor 128 has a drain connected to the second terminal of fuse 122 and the first input terminal of sense amplifier 124, a gate connected to the output terminal of driver 126, and a source connected to the second terminal of impedance element 118. Voltage source 130 has a positive terminal connected to the second input terminal of sense amplifier 124 for providing a reference voltage labeled "$V_{REF}$", and a negative input terminal connected to the second terminal of impedance element 120.

In operation, circuit 100 is a single-bit nonvolatile memory that is useful for a variety of purposes, such as a bit of a low capacity memory or a configuration bit. In order to program fuse 122, other circuitry (not shown in FIG. 1) provides the BIT signal at a logic high voltage. In response, driver 126 drives the gate of transistor 128 to a logic high value, thereby making it conductive. Driver 126 makes transistor 128, which is large enough to conduct a relatively large current, conductive. Transistor 128 is conductive to create a connection between $V_{PROG}$ and ground through fuse 122. By conducting the relatively large current labeled "$I_{PROG}$", fuse 122 undergoes a resistance change caused by first a silicide diffusion followed by lateral silicide migration (agglomeration) and polysilicon depletion (electromigration). As a result of the change in resistance resulting from the above described phase changes fuse 122 is considered blown (programmed).

Unfortunately, the process of determining the appropriate amount of time for which to apply this programming stimulus to transistor 128 and thereby programming fuse 122 at the correct resistance target is difficult. $I_{PROG}$ is a function of process and temperature variations as applied to the parametric performance of the programming circuit, as well as the value of $V_{PROG}$. For example, if the programming period is too short, fuse 122 may not be completely blown. On the other hand, if the period is too long, the fuse 122 resistance may drop rendering it unusable.

The issues with determining an appropriate programming period are compounded because parasitic impedances $Z_{P1}$-$Z_{P6}$ further contribute to variations in programming voltage across, and current through fuse 122. Therefore, the programming of fuse 122 is typically preformed at a relatively low current density that results in a resistance change of fuse 122 by transition through a series of distinct phases. Note that the prior art is performed at low current density because the prior art seeks silicide migration as a means to change resistance. In the case of a silicided polysilicon fuse, these phases can include silicide diffusion, lateral silicide migration (agglomeration), and polysilicon depletion (electromigration). However, programming fuse 122 at such a low current density is relatively slow, resulting in long programming times. Moreover, small variations in process and temperature or $V_{PROG}$ result in improperly blown fuses or a wide distribution in final resistance even when programmed for the specified time. Therefore, integrated circuit manufacturers can find it difficult to program such memory cells themselves and/or place tight, often impossible to ensure, constraints on their customers who perform the programming. It is also desirable in many cases to program memory cells at different temperatures to ensure the accuracy of parameters being programmed in normal use at those temperatures. Therefore, it is desirable to provide a robust solution that can be used for programming memory cells over a wide range of programming temperature as well.

Figure 2:
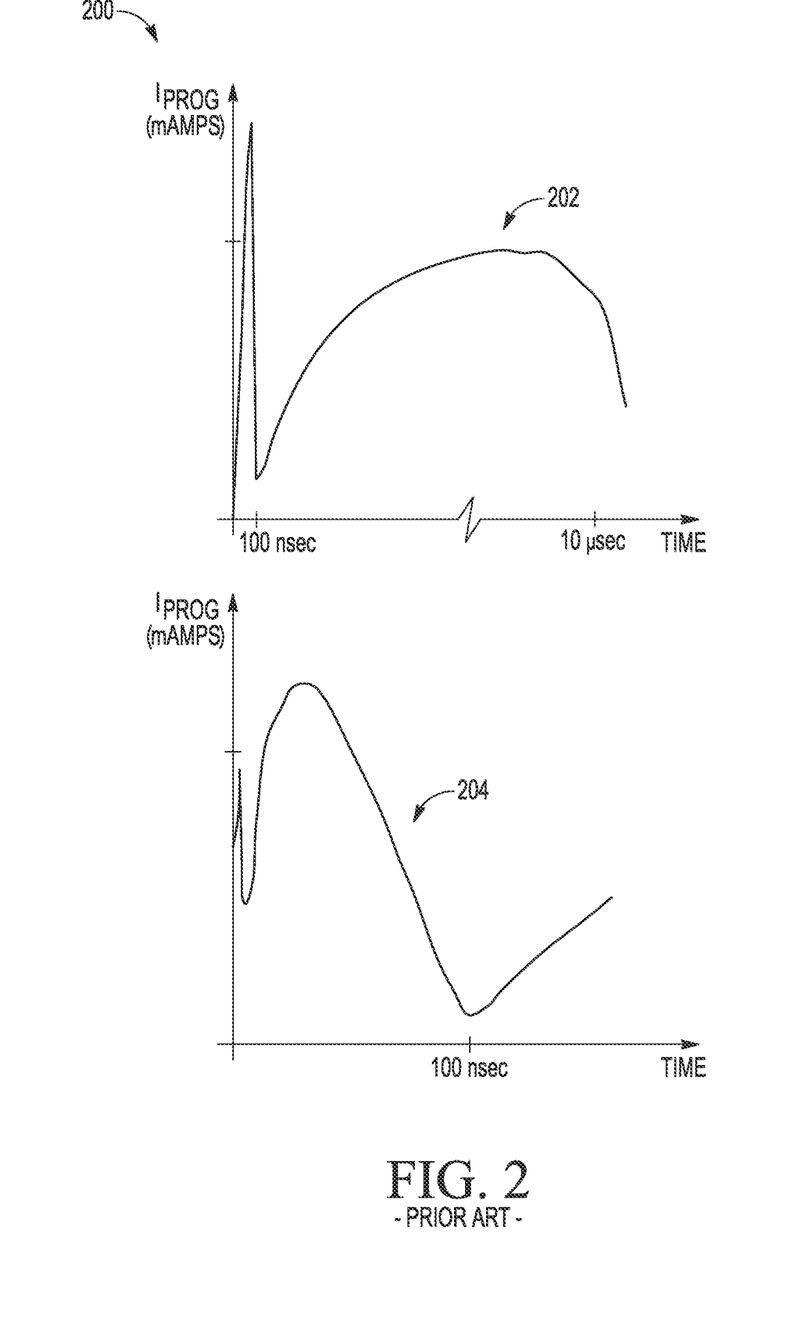
FIG. 2 illustrates a timing diagram useful in understanding the circuit of FIG. 1.

FIG. 2 illustrates a timing diagram 200 useful in understanding how circuit 100 of FIG. 1 can operate. Timing diagram 200 includes two graphs 202 and 204 which show programming current $I_{PROG}$ over a programming period. Graph 202 depicts time in microseconds along the horizontal axis (x-axis) and current in milliamperes (mAmps) along the vertical axis (y-axis). Graph 204 illustrates a portion of graph 202 which depicts time in nanoseconds along the horizontal axis (x-axis) and current in mAmps along the vertical axis (y-axis) to better show the features of graph 202. As can be seen from graphs 202 and 204, $I_{PROG}$ varies greatly over programming periods of 10 microseconds or more due to transition through the different programming phases of a silicided polysilicon fuse.

In the illustrated example, $I_{PROG}$ is first indicative of the value of the initial silicided polysilicon resistance. $I_{PROG}$ then decreases as the silicide layer of the resistor, which carries nearly all of the initial current, undergoes rapid heating, which increases the overall resistance. The heating eventually causes charge carrier amplification in the resistor stack and $I_{PROG}$ again increases. After $I_{PROG}$ peaks, the silicide undergoes electromigration which causes voiding at the center of fuse 122 and results in the highest resistance and lowest current at around 100 ns. However, after the resistance has reached this highest level, $I_{PROG}$ again begins to increase when stress migration has begun working with the electromigration forces start to change the void characteristics, eventually resulting in refilling of the void and lowering the final resistance of fuse 122.

As graphs 202 and 204 of FIG. 2 shows, the time period at which the resistance is suitably high only occurs for a short period of time. The period of time in which this high resistance is obtained depends on process, stimuli, and temperature, and it is difficult for the designers to pick a fixed, acceptable programming period for all possible conditions. Additionally, the phase changes described above and indicated by graphs 202 and 204 only occur if the stimulus conditions are appropriate, such that $I_{PROG}$ is within a specific range over the course of the programming period. If $I_{PROG}$ is too high or too low during the programming period, the described sequence of phase transitions may occur in the incorrect order or not at all resulting in erroneous programming.

Figure 3:
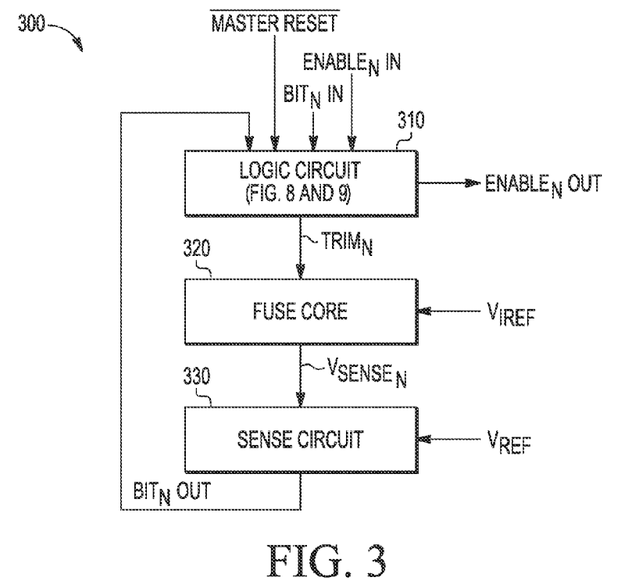
FIG. 3 illustrates in block diagram form a one-time programmable memory cell for programming a fuse according to an embodiment of the present invention.

FIG. 3 illustrates in block diagram form a one-time programmable memory cell 300 for programming a fuse according to an embodiment of the present invention. OTP memory cell 300 includes a logic circuit 310, a fuse core 320, and a sense circuit 330.

Logic circuit 310 has a first input for receiving an enable signal labeled "$ENABLE_N$ IN", a second input for receiving a bit (data) signal labeled "$BIT_N$ IN", a third input for receiving a reset signal labeled "$\overline{MASTERRESET}$", a fourth input for receiving a second bit (termination) signal labeled "$BIT_N$ OUT", a first output for providing a trim single labeled "$TRIM_N$", and a second output for providing an enable out signal labeled "$ENABLE_N$ OUT".

Fuse core 320 has an input connected to the first output of logic circuit 310 for receiving the $TRIM_N$ signal, a second input for receiving a voltage labeled "$V_{IREF}$", and an output labeled "$V_{SENSEN}$". Sense circuit 330 has an input connected to the output of fuse core 320 for receiving a sense voltage, a second input for receiving a reference voltage labeled "$V_{REF}$", and an output connected to the fourth input of logic circuit 310 for providing the $BIT_N$ OUT signal.

In operation, logic circuit 310 is capable of selectively activating the $TRIM_N$ signal after an inactivation of the $\overline{MASTERRESET}$ signal. Logic circuit 310 receives the $BIT_N$ IN signal and the $ENABLE_N$ IN signal and, in response to the activation of the $ENABLE_N$ IN signal, selectively activates the $TRIM_N$ signal based on the state of $BIT_N$ IN. If $BIT_N$ IN is a logic low, logic circuit 310 keeps $TRIM_N$ inactive, but if $BIT_N$ IN is a logic high, logic circuit 310 activates $TRIM_N$.

While the $TRIM_N$ signal is active, fuse core 320 applies a substantially constant current through a programmable fuse within fuse core 320 at a value set by $V_{IREF}$. As the current flows through the programmable fuse, fuse core 320 also provides a sense voltage responsive to the resistance of the fuse to the output. Sense circuit 330 monitors the sense voltage to compare the sense voltage with $V_{REF}$. Eventually, the fuse resistance within fuse core 320 substantially increases causing a rapid drop in the sense voltage triggering sense circuit 330 to activate the $BIT_N$ OUT signal. In response, logic circuit 310 rapidly deactivates the $TRIM_N$ signal, which prevents the current within fuse core 320 from flowing and ends the programming period. In response to the activation of $BIT_N$ OUT, logic circuit 310 activates the $ENABLE_N$ OUT signal. Alternatively if $ENABLE_N$ IN is activated but $BIT_N$ IN is a logic low state, logic circuit 310 also activates the $ENABLE_N$ OUT signal.

The operation as described has several advantages over circuit 100 of FIG. 1. By including feedback from the sense circuit 330 to the logic circuit 310 for monitoring the voltage at the output of fuse core 320, OTP memory cell 300 is able to self-terminate upon reaching the desired fuse resistance threshold in the instance that voiding is substantially fully formed within the fuse of the fuse core 320, substantially negating the risk of re-flowing as discussed above with respect to FIG. 2. Additionally, OTP memory cell 300 allows fuse core 320 to be programmed at a much faster rate by applying a much larger current density to the fuse than circuit 100, as the programming can be terminated at the instant the void is fully formed. Further, the programming period is no longer predetermined but rather automatically ends at about the point of fuse voiding and maximum resistance, automatically accounting for all aforementioned variations, and allowing for the shortest possible reliable programming time.

Another benefit of cell 300 is that multiple instances may be cascaded to form a multiple-bit OTP memory such that the programming of a subsequent memory cell starts when the programming of a prior memory cell is complete (or the prior memory cell's fuse need not be blown). By using the enable out signal of a first cell as the enable in signal for the second cell in the cascade of OTP memory cells the $k^{th}$ cell begins programming in response to completions of the programming by the $k^{th-1}$ cell. By self-terminating and cascading the programming operation, programming of an OTP memory including OTP memory cell 300 can be accomplished reliably. It should be noted that in an alternate embodiment multiple sets of OTP memory cells 300 less than the total number of OTP memory cells can be programmed simultaneously, such as by having different cascading chains of OTP memory cells. Additionally, a single sense circuit could be utilized for sensing the state of multiple fuse cores by multiplexing the $V_{SENSEN}$ and $BIT_N$ OUT signals.

Figure 4:
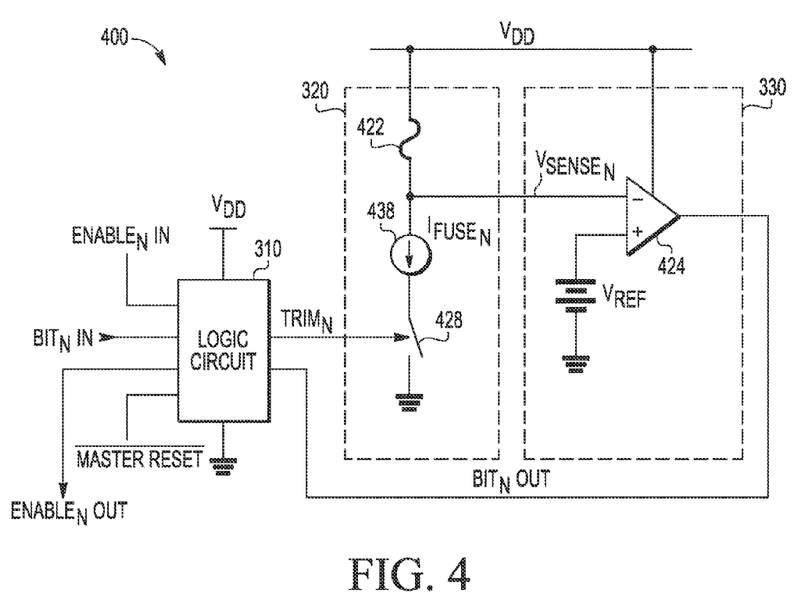
FIG. 4 illustrates in partial block diagram and partial schematic form an implementation of the one-time programmable memory cell of FIG. 3.

FIG. 4 illustrates in partial block diagram and partial schematic form an implementation 400 of the one-time programmable memory cell 300 of FIG. 3. OTP memory cell 400 includes generally logic circuit 310, fuse core 320, and sense circuit 330. In the illustrated embodiment, OTP memory cell 400 is a single OTP memory cell N of a multiple-cell OTP memory.

Fuse core 320 includes a fuse 422, a current source 438 and a switch 428. Fuse 422 has a first terminal for receiving $V_{DD}$, and a second terminal. Current source 438 has a first terminal connected to the second terminal of fuse 422 and a second terminal, and has current $I_{FUSEN}$ associated therewith. Switch 428 has a first terminal connected to the second terminal of current source 338, a control terminal, and a second terminal connected to ground.

Sense circuit 330 includes a comparator 424 and a voltage source for providing $V_{REF}$. Comparator 424 has a negative terminal connected to the second terminal of fuse 422 for receiving a voltage labeled "$V_{SENSEN}$", a positive terminal for receiving $V_{REF}$, a positive power supply input terminal for receiving $V_{DD}$, and an output terminal for providing the $BIT_N$ OUT signal.

Logic circuit 310 has a first input terminal for receiving the $ENABLE_N$ IN signal, a second input terminal for receiving the $BIT_N$ IN signal, a positive power supply input terminal connected to an internal power supply voltage terminal labeled "$V_{DD}$", a negative power supply input terminal connected to ground, a third input terminal connected to the output terminal of comparator 424 for receiving the $BIT_N$ OUT signal, an output terminal for providing the $TRIM_N$ signal to the control terminal of switch 428, and a second output terminal for providing the $ENBLE_N$ OUT signal, which indicates the completion of the programming of the OTP cell N to the next OTP memory cell N+1.

It should be noted that a supply voltage applied to both fuse core 320 and sense circuit 330 may be different than the supply voltage applied to logic circuit 310 in an alternate embodiments.

In order to program fuse 422, logic circuit 310 receives the $BIT_N$ IN signal at a logic high voltage from other circuitry (not shown in FIG. 4) and the $ENABLE_N$ IN signal from the previous OTP memory cell N−1. It should be noted that if the $N^{th}$ OTP memory cell has no previous cell that the $ENABLE_N$ IN signal may be preset to active, such as when the $N^{th}$ memory cell is the first OTP memory cell to be programmed. In response to receiving the $ENABLE_N$ IN signal and $BIT_N$ IN being in a logic high state, logic circuit 310 activates the $TRIM_N$ signal, which closes switch 428. When switch 428 is closed, current source 438 provides a substantially constant current ($I_{FUSEN}$) from $V_{DD}$ to ground through fuse 422, eventually causing the desired highest resistance phase transition in fuse 422.

During this transition in fuse 422, $V_{SENSEN}$ rapidly drops in value until it is falls below $V_{REF}$. Once $V_{SENSEN}$ falls below $V_{REF}$, comparator 424 activates the $BIT_N$ OUT signal. In a typical embodiment, comparator 424 will have built in hysteresis to ensure a single, sharp signal transition on $BIT_N$ OUT. In response to the activation of the $BIT_N$ OUT signal, logic circuit 310 rapidly deactivates the $TRIM_N$ signal, causing switch 428 to open, thereby preventing any further flow of current from $V_{DD}$ to ground, and activates the $ENABLE_N$ OUT signal which acts as the $ENABLE_{N+1}$ IN signal for the next one-time programmable memory cell N+1. In an alternative embodiment, $V_{REF}$ may be referenced to $V_{DD}$ as opposed to ground, such that $V_{REF}$ is directly compared to the voltage across the fuse by sense circuit 310.

It should be noted that alternate embodiments of comparator 424 are contemplated. For example, comparator 424 may include simple logical elements such as inverters or even single transistors that have built in references based on transistor thresholds and supply voltage.

Figure 5:
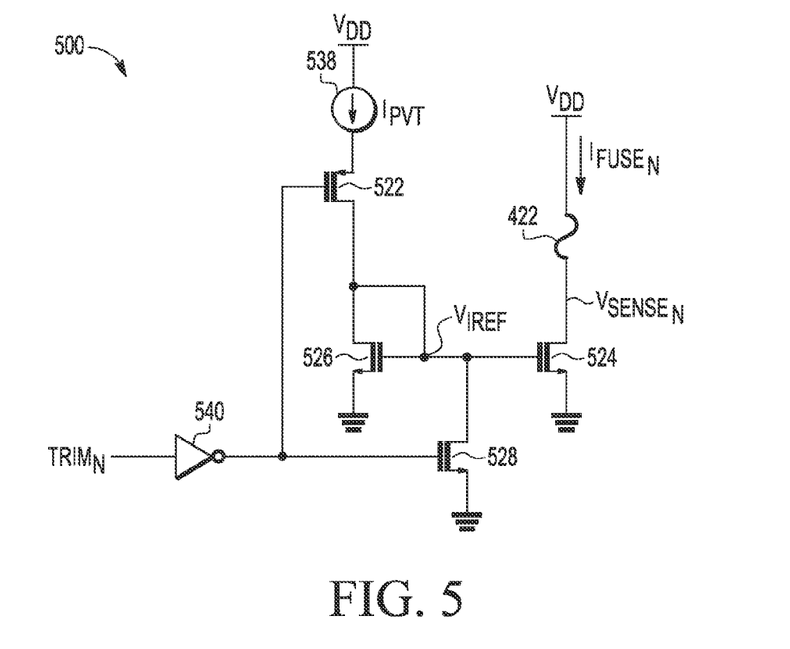
FIG. 5 illustrates in schematic form an embodiment of the fuse core of FIGS. 3 and 4 including a switched current source.

FIG. 5 illustrates in schematic form an embodiment 500 of the fuse core 320 of FIGS. 3 and 4 including a current source 538. Fuse core 500 also includes an inverter 540, a fuse 422, and transistors 522, 524, 526, and 528.

Current source 538 has a first terminal connected to $V_{DD}$, and a second terminal. Fuse 422 has a first terminal connected to $V_{DD}$, and a second terminal. Inverter 540 has an input terminal for receiving the $TRIM_N$ signal from logic circuit 310, and an output terminal. Transistor 522 has a first current electrode connected to the second terminal of current source 538, a control electrode connected to the output terminal of inverter 540, and a second current electrode. Transistor 526 has a first current electrode connected to the second current electrode of transistor 522 for providing a voltage labeled "$V_{IREF}$", a control electrode connected to the second current electrode of transistor 522, and a second current electrode connected to ground. Transistor 528 has a first current electrode connected to the second current electrode of transistor 522, a control electrode connected to the output terminal of inverter 540, and a second current electrode connected to ground. Transistor 524 has a first current electrode connected to the second terminal of fuse 422, a control electrode connected to the second current electrode of transistor 522 for receiving $V_{IREF}$, and a second current electrode connected to ground.

Current source 538 has an associated current $I_{PVT}$, which is a current designed to vary based on process and temperature and not to vary as a function of supply voltage $V_{DD}$. The variation of value in current source 538 is designed to track variations in fuse characteristics through the use of similar design elements in the current generation circuit. The value of current source 538 is designed to be a function of ambient, initial circuit temperature such that the fuse undergoes the desired phase transitions resulting in maximum programmed resistance value as previously described. Designing a current source 538 independent of the value of supply voltage $V_{DD}$ removes the negative effects of circuit parasites as described previously. In one embodiment, a single current source 538 provides $I_{PVT}$ to a selected one of multiple fuse cores through application of voltage $V_{IREF}$. This sharing allows current source 538 to be a high precision current source without requiring a large integrated circuit area. In another embodiment, each fuse core of a programmable memory has its own current source responsive to the characteristics of various fuses used in each of the fuse cores.

In operation, $TRIM_N$ is first in a low state, transistor 522 is nonconductive and transistor 528 is conductive such that transistors 524 and 526 are deactivated. $TRIM_N$ goes high to commence programming of fuse 422 and, in response, transistor 522 becomes conductive and transistor 528 becomes nonconductive further causing $I_{FUSEN}$ to flow through fuse 422 at a current proportional to $I_{PVT}$. $I_{FUSEN}$ continues to flow through fuse 422 until fuse 422 is effectively programmed.

It should be noted that sense circuit 330 of FIGS. 3 and 4 monitors the voltage labeled "$V_{SENSEN}$" on the second terminal of fuse 422, such that when $V_{SENSEN}$ drops below $V_{REF}$ sense circuit 330 is able to provide $BIT_N$ OUT which cause $TRIM_N$ to go inactive, making transistor 522 nonconductive and making transistor 528 conductive, thereby preventing further application of $I_{FUSEN}$ to fuse 422.

Figure 6:
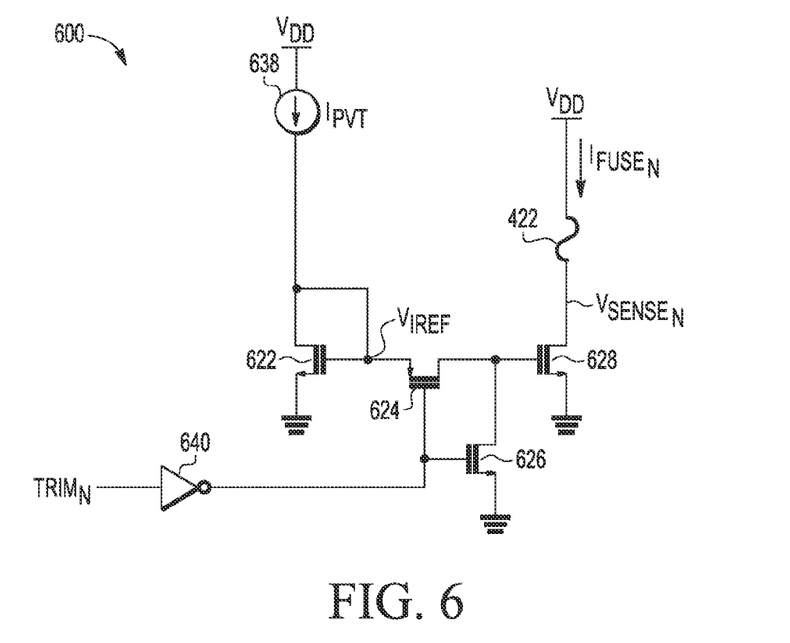
FIG. 6 illustrates in schematic form a second embodiment of the fuse core of FIGS. 3 and 4 including another switched current source.

FIG. 6 illustrates in schematic form a second embodiment 600 of the fuse core of FIGS. 3 and 4 including another current source 638. Fuse core 600 also includes inverter 640, fuse 422, and transistors 622, 624, 626, and 628.

Current source 638 has a first terminal connected to $V_{DD}$ and a second terminal. Fuse 422 has a first terminal connected to $V_{DD}$ and a second terminal. Inverter 540 has an input terminal for receiving the $TRIM_N$ signal from logic circuit 310 and an output terminal. Transistor 622 has a first current electrode to the second terminal of current source 638 for providing $V_{IREF}$, a control electrode, and a second current electrode connected to ground. Transistor 624 has a first current electrode connected to the second terminal of current source 638, a control electrode connected to the output terminal of inverter 640, and a second current electrode connected. Transistor 626 has a first current electrode connected to the second current electrode of transistor 624, a control electrode connected to the output terminal of inverter 640, and a second current electrode connected to ground. Transistor 628 has a first current electrode connected to the second terminal of fuse 422, a control electrode connected to the second current electrode of transistor 624, and a second current electrode connected to ground.

Current source 638 has an associated current $I_{PVT}$, which is a current designed to vary based on process, voltage, and temperature and not to vary as a function of supply voltage $V_{DD}$. The variation of value in current source 638 is designed to track variations in fuse characteristics through the use of similar design elements in the current generation circuit. The value of current source 638 is designed to be a function of ambient, initial circuit temperature such that the fuse undergoes the desired phase transitions resulting in maximum programmed resistance value as previously described. Designing a current source 638 independent of the value of supply voltage $V_{DD}$ removes the negative effects of circuit parasites as described previously. In one embodiment, a singled current source 638 provides $I_{PVT}$ to a selected one of multiple fuse cores through application of $V_{IREF}$. Current source 638 is thus able to be a high precision current without requiring a large integrated circuit area. In another embodiment, each fuse core of a programmable memory has its own current source responsive to the characteristics of various fuses used in each of the fuse cores.

The $TRIM_N$ signal is first in a low state, transistor 624 is nonconductive, and transistor 626 is conductive. Once programming commences, $TRIM_N$ goes high and, in response, transistor 624 becomes conductive and transistor 626 becomes nonconductive causing $I_{FUSEN}$ to flow through fuse 422 at a current proportional to $I_{PVT}$. $I_{FUSEN}$ continues to flow through fuse 422 until fuse 422 is effectively programmed.

It should be noted that sense circuit 330 of FIGS. 3 and 4 monitors $V_{SENSEN}$ on the second terminal of fuse 422, such that when $V_{SENSEN}$ drops below $V_{REF}$ sense circuit 330 is able to provide $BIT_N$ OUT which cause $TRIM_N$ to go inactive, making transistor 624 nonconductive and making transistor 626 conductive, thereby preventing further application of $I_{FUSEN}$ to fuse 422.

Figure 7:
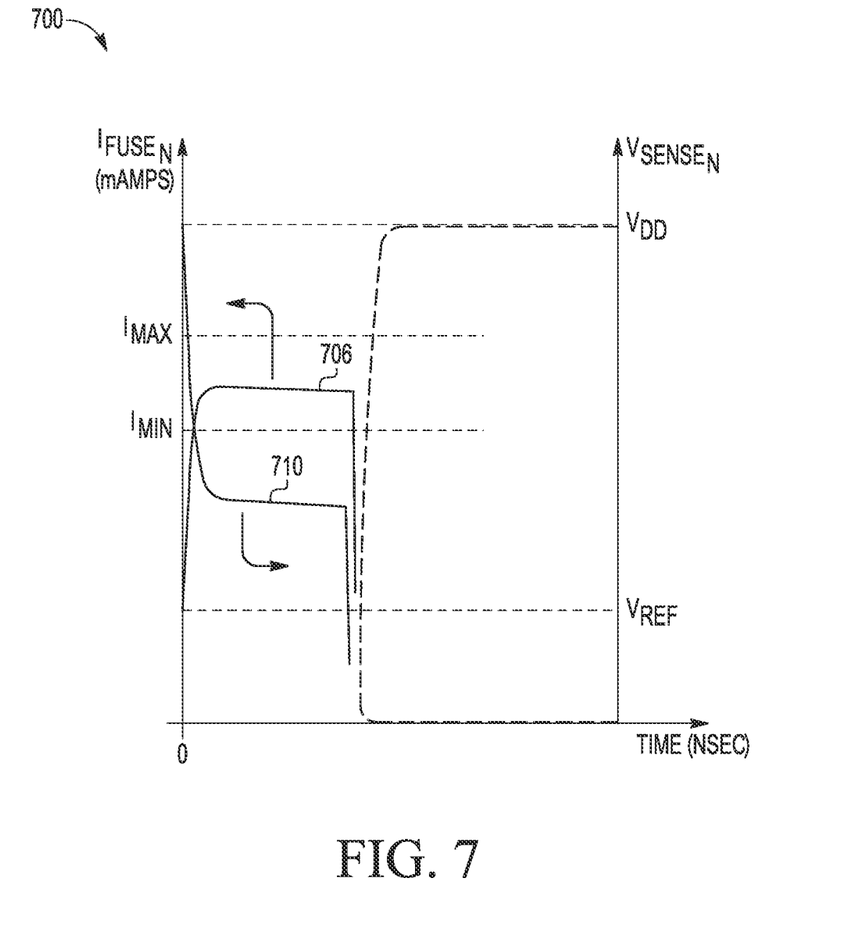
FIG. 7 illustrates a timing diagram useful in understanding the operation of the one-time programmable memory cell of FIGS. 3 and 4.

FIG. 7 illustrates a timing diagram 700 useful in understanding the one-time programmable memory cell 300 of FIGS. 3 and 4. Timing diagram 700 represents time in nanoseconds along the horizontal axis, programming current in milliamperes (mAmps) along the left vertical axis labeled "$I_{FUSEN}$", and sense voltage in volts along the right vertical axis labeled "$V_{SENSEN}$". Timing diagram 700 includes a waveform 706 which shows changes in $I_{FUSEN}$ of FIGS. 3-6 during the programming period and waveform 710 which shows changes in $V_{SENSEN}$ of FIGS. 3-6 during the programming period. Timing diagram 700 also illustrates voltage $V_{DD}$, voltage $V_{REF}$, a current level labeled "$I_{MAX}$", and a current level labeled "$I_{MIN}$".

Before the programming period of fuse 422, waveform 706 is initially close to zero amps before current starts to flow through fuse 422 and waveform 710 is initially close to $V_{DD}$. Programming begins when logic circuit 310 activates the $TRIM_N$ signal, as described above. Activating the $TRIM_N$ signal causes $I_{FUSEN}$ to rapidly increase to a level above $I_{MIN}$ but below $I_{MAX}$ where it remains approximately constant during the programming period. Waveform 710 rapidly decreases corresponding to the initial rapid increase of $I_{FUSEN}$ as the resistance of fuse 422 increases. An immediate drop in waveform 706 occurs because of the rapid phase transition of the fuse 422 when it reaches the desired programming state of maximum resistance. In response to the fuse transitioning to this state, $V_{SENSEN}$ rapidly decreases to a level below $V_{REF}$. Sense circuit 330 of FIG. 3 is able to detect when $V_{SENSEN}$ drops below $V_{REF}$ and, in response, activates the $BIT_N$ OUT signal. The activation of the $BIT_N$ OUT signal causes logic circuit 310 to deactivate the $TRIM_N$ signal, terminating the programming of fuse 422 and shutting off the flow of $I_{FUSEN}$ current, preventing any further programming of fuse 422. When the transistor in the fuse path such as transistor 628 of FIG. 6 becomes nonconductive, $V_{SENSEN}$ immediately increases back to the level of $V_{DD}$.

Figure 8:
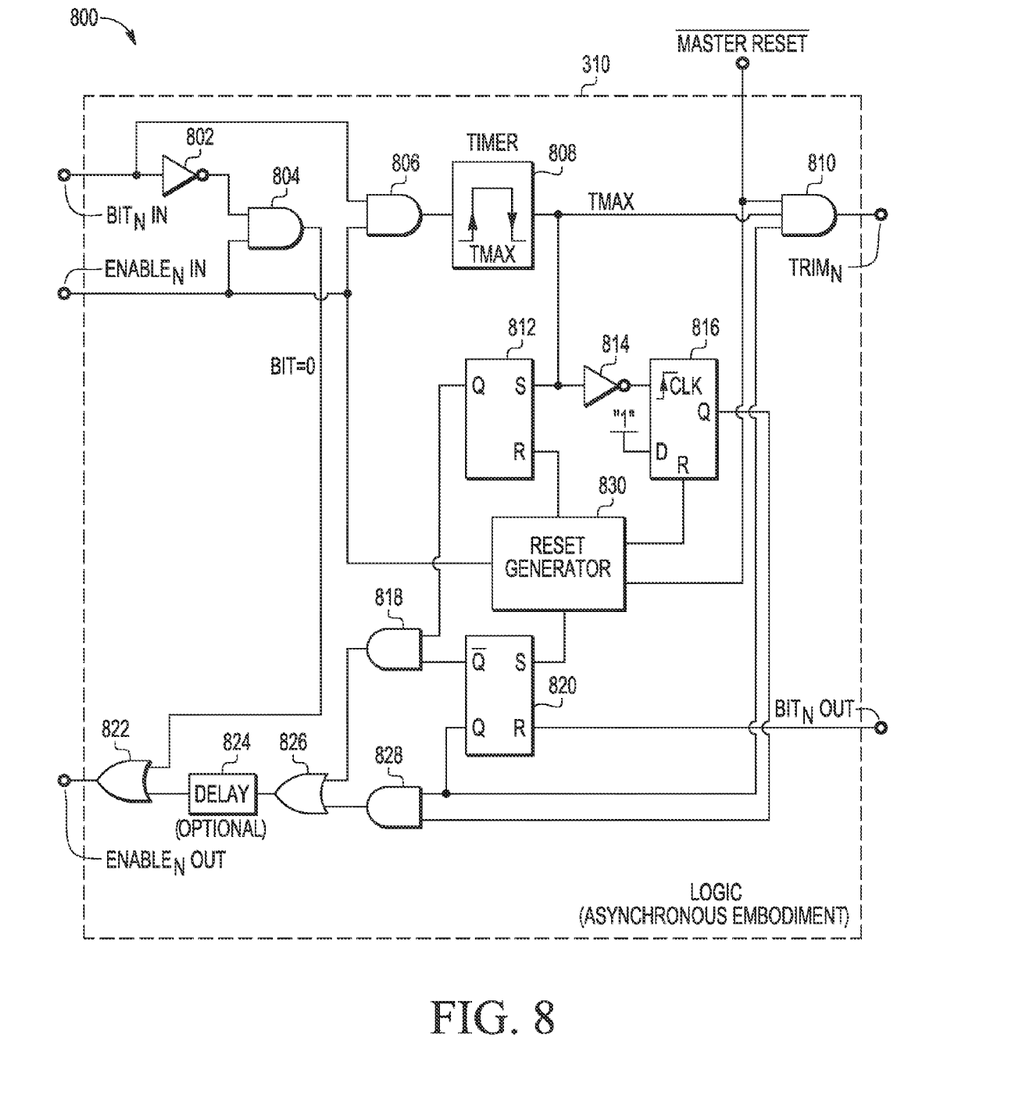
FIG. 8 illustrates in partial block diagram and partial schematic form an embodiment of the logic circuit of FIGS. 3 and 4.

FIG. 8 illustrates in partial block diagram and partial schematic form an embodiment 800 of logic circuit 310 of FIGS. 3 and 4. Logic circuit 800 has inverters 802 and 814, AND gates 804, 806, 810, 818, 828, OR gates 822 and 826, timer 808, reset generator 830, latches 812, 816, and 820, and optional delay element 824.

Inverter 802 has an input terminal for receiving the $BIT_N$ IN signal and an output terminal. AND gate 804 has a first input terminal connected to the output terminal of inverter 802, a second input terminal for receiving the $ENABLE_N$ IN signal, and an output terminal. AND gate 806 has a first input terminal for receiving the $BIT_N$ IN signal, a second input terminal for receiving the $ENABLE_N$ IN signal, and an output terminal. Timer 808 has an input terminal connected to the output terminal of AND gate 806 and an output terminal for providing a signal labeled "TMAX". AND gate 810 has a first input terminal for receiving the $\overline{MASTERRESET}$ signal, a second input terminal connected to the output terminal of timer 808 for receiving signal TMAX, a third input terminal, and an output terminal for providing the $TRIM_N$ signal. Latch 812 has a set input terminal labeled "S" connected to the output terminal of timer 808 for receiving signal TMAX, a reset input terminal labeled "R", and an output terminal labeled "Q". Inverter 814 has an input terminal connected to the output terminal of timer 808 for receiving signal TMAX, and an output terminal. Latch 816 has a data input terminal labeled "D", a reset input terminal labeled "R", a clock input terminal labeled "CLK", and an output terminal labeled "Q". Reset generator 830 a first input terminal for receiving the $ENABLE_N$ IN signal, and a second input terminal for receiving the $\overline{MASTERRESET}$ signal, a first output terminal connected to the R terminal of latch 816, a second output terminal connected to the R terminal of latch 812, and a third output terminal. AND gate 818 has a first input terminal connected to the output terminal of latch 812, a second input terminal, and an output terminal. Latch 820 has a set input terminal labeled "S" connected to the third output terminal of reset generator 830, a reset input terminal labeled "R" for receiving the $BIT_N$ OUT signal, a first output terminal labeled "$\overline{Q}$" connected to the second input terminal of AND gate 818, and a output terminal labeled "Q" connected to the third input terminal of AND gate 810. OR gate 822 has a first input terminal connected to the output terminal of AND gate 804, a second input terminal, and an output terminal for providing the $ENABLE_N$ OUT signal. Delay 824 has an input terminal, and an output terminal connected to the second input terminal of OR gate 822. OR gate 826 has a first input terminal connected to the output terminal of AND gate 818, a second input terminal, and an output terminal connected to the input terminal of delay 824. AND gate 828 has a first input terminal connected to the Q output terminal of latch 820, a second input terminal connected to the Q output terminal of latch 816, and an output terminal connected to the second input terminal of OR gate 826.

In an example where it is desirable to program an Nth bit, the $BIT_N$ IN signal is set to a high state. In this example, and in response to the $ENABLE_N$ IN signal going high, the output of AND gate 806 transitions to a logic high state. As a result of the output of AND gate 806 going high, timer 808 creates a pulse of a predetermined time on the node indicated by TMAX, which presents a logic high to the second input of AND gate 810, and sets latch 812. Signal TMAX controls the maximum time that the $TRIM_N$ signal remains active. Should the fuse in consideration fail to program to the final desirable state during the duration of the TMAX time period, the transition of the TMAX signal to a logic low state causes $TRIM_N$ to transition to a logic low state thereby preventing further programming. Reset generator 830 sets latch 820 in response to receiving the $ENABLE_N$ IN and $\overline{MASTERRESET}$ signals. If latch 820 is set, the Q output of latch 820 goes high making the third input of AND gate 810 high. The first input of AND gate 810 is active when the $\overline{MASTERRESET}$ signal is high. Thus when the $ENABLE_N$ IN signal, the $BIT_N$ IN signal, and the $\overline{MASTERRESET}$ signal are high AND gate 810 activates the $TRIM_N$ signal.

At a time after the $TRIM_N$ signal is activated and the fuse reaches the desired programmed state, sense circuit 330 activates the $BIT_N$ OUT signal, in response to sense circuit 330 detecting that $V_{SENSEN}$ has dropped below $V_{REF}$ as described above. As a result of the $BIT_N$ OUT signal going high, the $\overline{Q}$ output of latch 820 is set to high and the Q output of latch 820 is set to low. The low signal on the Q output of latch 820 indicates that the programming of fuse 422 is complete. Thus, AND gate 810 deactivates the $TRIM_N$ signal when the Q output goes low. In response to the $\overline{Q}$ output going high, and because the S input of latch 812 was activated by the logic high state of TMAX resulting in the Q output going high, the output of AND gate 818 goes high and the output of OR gate 826 goes high. When OR gate 826 output goes high, OR gate 822 activates the $ENABLE_N$ OUT signal. In one particular example, delay 824 delays OR gate 822 from activating the $ENABLE_N$ OUT signal for a particular amount of time which could be made to equal or greater than the time it takes logic circuit 310 to shut off the $TRIM_N$ signal or for signals throughout the circuitry to stabilize.

It is possible that the fuse may fail to reach the desired programming state. If the fuse fails to reach this state, the Q output of latch 820 remains high but the second input of AND gate 810 goes low as the pulse generated by timer 808 expires as described previously. In response to the expiration of signal TMAX indicated by a transition to a low state, the output of inverter 814 transitions to a high state. This positive transition causes a logic high state to be read into the latch 816 through a logic high state on the D input and appearing on the Q output. As a result of the Q output of latch 816 going high, AND gate 828 output goes high indicating that the fuse failed to reach the desired programming state during the TMAX time period. If the output of AND gate 828 goes high, the output of OR gate 826 also goes high and OR gate 822 activates the $ENABLE_N$ OUT signal after the optional delay as described above. If it is desirable to add redundant memory cells to a particular embodiment to account for the failure of fuses to reach a satisfactory programmed state, the signal on the output of the AND gate 828 can be disconnected from the input of OR gate 826 and rerouted through another memory cell. Once this separate memory cell has been programmed, its $ENABLE_N$ OUT signal connected to the input of OR gate 826 causes the desired further memory programming.

In another example the $BIT_N$ IN signal is low and the $ENABLE_N$ IN signal transitions to a high state. In this example fuse 422 should not be programmed and the output of AND gate 806 remains low, therefore, the $TRIM_N$ signal is not activated. However, the output of inverter 802 transitions to a high state, causing the output of AND gate 804 to go high. In response to the output of AND gate 804 going high, OR gate 822 activates the $ENABLE_N$ OUT signal.

In either of the examples above, the activation of the $ENABLE_N$ OUT signal (the $ENABLE_{N+1}$ IN signal for the next memory cell) causes the next memory cell to begin programming its fuse if the $BIT_{N+1}$ IN signal is also high. Therefore, by configuring multiple OTP memory cells including logic circuits 310 together, the programming of each of the OTP memory cells is self-propagating. By using a programmable memory with self-propagating one-time programmable memory cells, memory 300 achieves the fastest possible, highly reliable, well controlled memory programming time. A logic high transition on the $ENABLE_N$ IN signal of the final memory cell stage indicates that programming of all memory cells has been completed.

In another example, the $ENABLE_N$ IN signal is low. In this example either the $ENABLE_N$ IN signal has not yet propagated to logic circuit 310 or there is no desire to program the cell. Regardless of whether the $BIT_N$ IN signal is high or low, logic circuit 310 remains inactive until it receives the $ENABLE_N$ IN signal.

Figure 9:
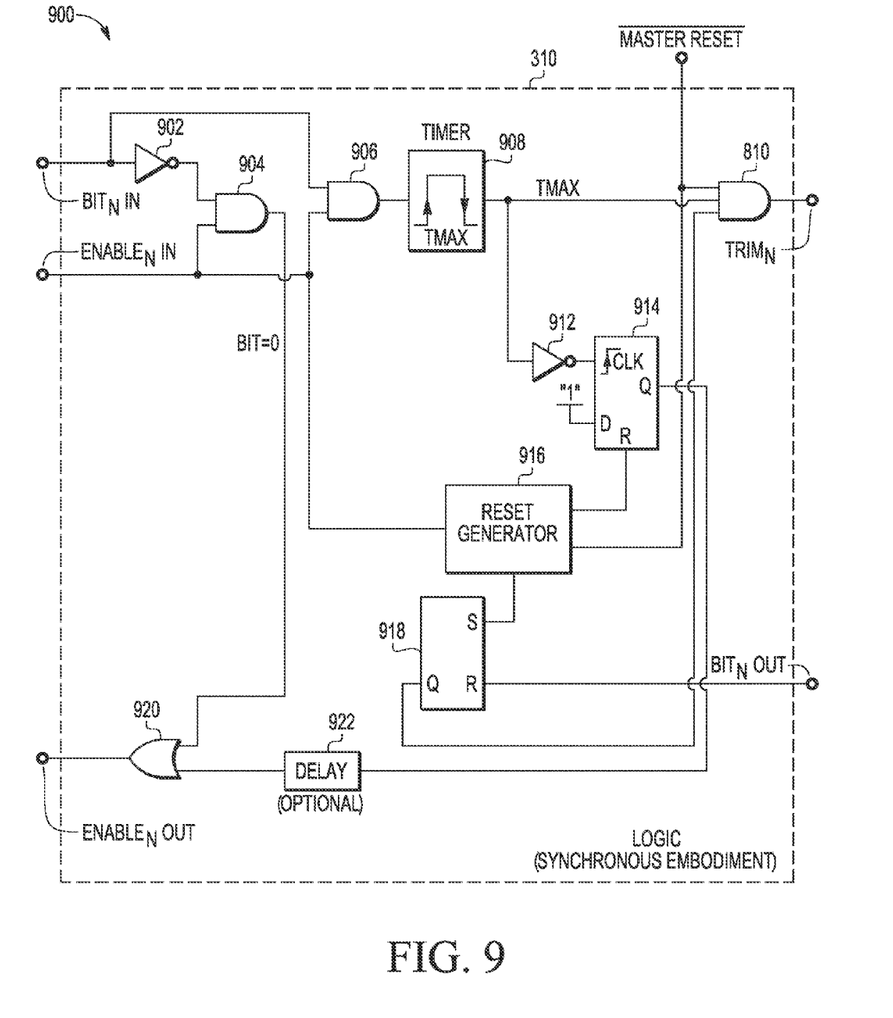
FIG. 9 illustrates in partial block diagram and partial schematic form a second embodiment of the logic circuit of FIGS. 3 and 4.

FIG. 9 illustrates in partial block diagram and partial schematic form an embodiment 900 of logic circuit 310 of FIGS. 3 and 4. Logic circuit 310 has inverters 902 and 912, AND gates 904, 906, 910, an OR gate 920, timer 908, reset generator 916, latches 914 and 918, and optional delay element 922.

Inverter 902 has an input terminal for receiving the $BIT_N$ IN signal and an output terminal. AND gate 904 has a first input terminal connected to the output terminal of inverter 902, a second input terminal for receiving the $ENABLE_N$ IN signal, and an output terminal. AND gate 906 has a first input terminal for receiving the $BIT_N$ IN signal, a second input signal for receiving the $ENABLE_N$ IN signal, and an output terminal. Timer 908 has an input terminal connected to the output terminal of AND gate 906 and an output terminal for providing the signal TMAX. AND gate 910 has an input terminal for receiving the $\overline{MASTERRESET}$ signal, a second input terminal connected to the output terminal of timer 908 for receiving signal TMAX, a third input terminal, and an output terminal for providing the $TRIM_N$ signal. Inverter 912 has an input terminal connected to the output terminal of timer 908 for receiving signal TMAX and an output terminal. Latch 914 has a data input terminal labeled "D", a reset input terminal labeled "R", a clock input terminal labeled "CLK" connected to the output terminal of inverter 912, and a output terminal labeled "Q". Reset generator 916 has a first input for receiving the $ENBALE_N$ IN signal, a second input terminal for receiving the $\overline{MASTERRESET}$ signal, a first output terminal connected to the R input terminal of latch 914, and a second output terminal. Latch 918 has a set input terminal labeled "S" connected to the second output terminal of reset generator 916, a reset input terminal labeled "R" for receiving the $BIT_N$ OUT signal, and an output terminal labeled "Q" connected to the third input terminal of AND gate 910. OR gate 920 has a first input terminal connected to the output terminal of AND gate 904, a second input terminal, and an output terminal for providing the $ENABLE_N$ OUT signal. Delay element 922 has an input terminal connected to the Q output terminal of latch 914 and an output terminal connected to the second input terminal of or gate 920.

In an example where it is desirable to program an $N^{th}$ bit, the $BIT_N$ IN signal is set to a high state. In this example, and in response to the $ENABLE_N$ IN signal going high, the output of and gate 906 transitions to a logic high state. As a result of the output of AND gate 906 going high, timer 908 creates a pulse of a predetermined time on the node indicated by TMAX, which presents a logic high to the second input of AND gate 910 and sets latch 914. Signal TMAX controls the maximum time that the $TRIM_N$ signal remains active. Should the fuse in consideration fail to program to the final desirable state during the duration of the TMAX time period, the transition of the TMAX signal to a logic low state will cause $TRIM_N$ to transition to a logic low state thereby preventing further programming. Reset generator 916 also sets latch 918 in response to receiving the $ENABLE_N$ IN signal and the $\overline{MASTERRESET}$ signals. If latch 918 is set, the Q output of latch 918 goes high making the third input of AND gate 910 high. The first input of AND gate 910 is active when the $\overline{MASTERRESET}$ signal is high. Thus when the $ENABLE_N$ IN signal, the $BIT_N$ IN signal, and the $\overline{MASTERRESET}$ signal are high AND gate 810 activates the $TRIM_N$ signal.

At a time after the $TRIM_N$ signal is activated and the fuse reaches the desired programmed state, sense circuit 330 activates the $BIT_N$ OUT signal, in response to sense circuit 330 detecting that $V_{SENSEN}$ has dropped below $V_{REF}$ as described above. As a result of the $BIT_N$ OUT signal going high, the Q output of latch 918 is set to low. The low signal on the Q output of latch 820 indicates that the programming of fuse 422 is complete. Thus, AND gate 810 deactivates the $TRIM_N$ signal when the Q output goes low.

Whether or not the fuse is properly blown the pulse signal TMAX generated by timer 908 expires. As the pulse expires, the Q output of latch 914 goes high. In response to the Q output of latch 914 going high, OR gate 920 activates the $ENABLE_N$ OUT signal after the optional delay.

In another example the $BIT_N$ IN signal is low and the $ENABLE_N$ IN signal transitions to a high state. In this example fuse 422 should not be programmed and the output of AND gate 906 remains low, therefore, the $TRIM_N$ signal is not activated. However, the output of inverter 902 transitions to a high state, causing the output of AND gate 904 to go high. In response to the output of AND gate 904 going high, OR gate 920 activates the $ENABLE_N$ OUT signal.

In either of the examples above, the activation of the $ENABLE_N$ OUT signal (the $ENABLE_{N+1}$ IN signal) causes the next programmable memory to begin programming of its fuse if the $BIT_{N+1}$ IN signal is also high. Therefore, by configuring multiple OTP memory cell including logic circuits 310 together the programmable of each of OTP cells of the OTP memory is self-propagating.

Figure 10:
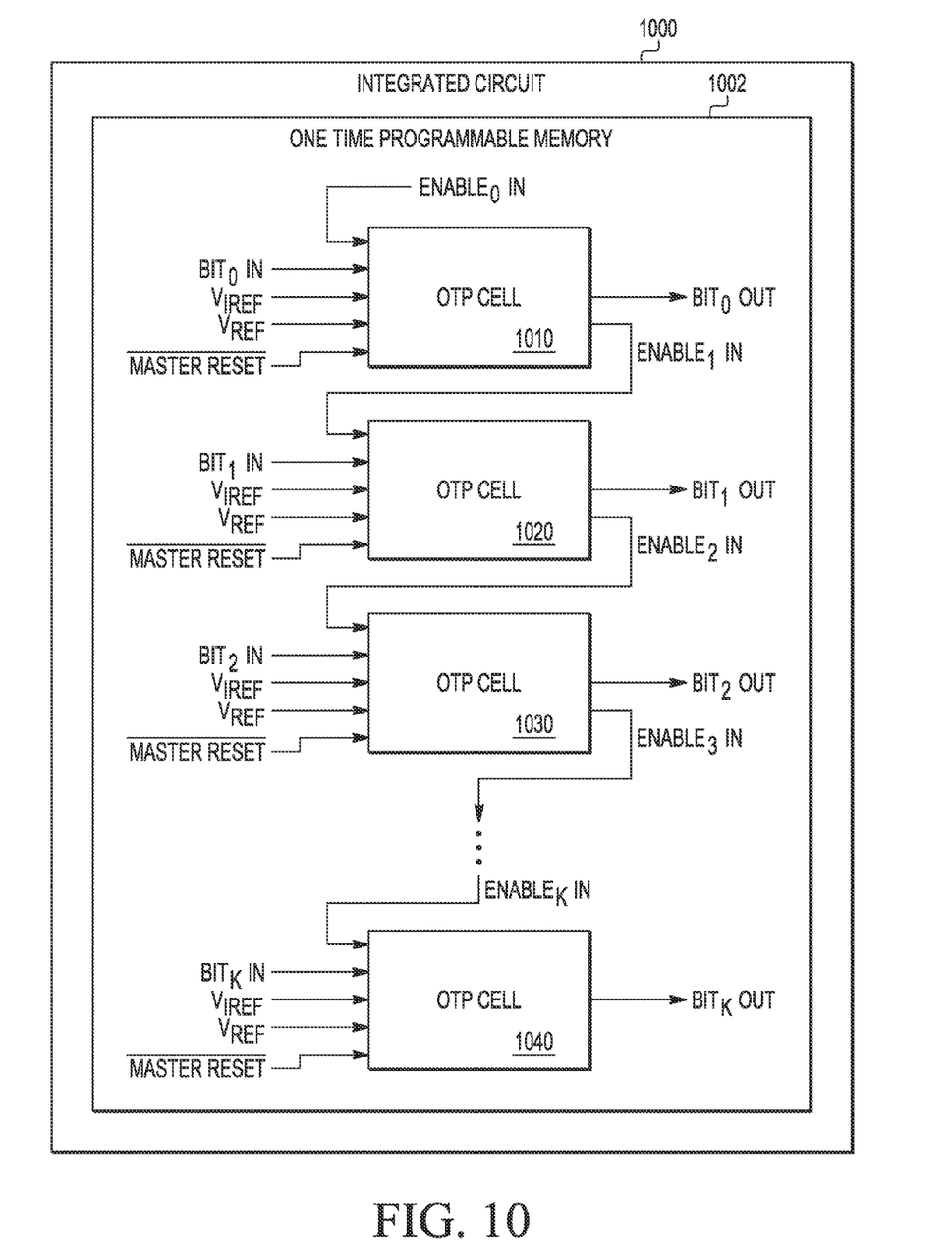
FIG. 10 illustrates a block diagram of an integrated circuit with the one-time programmable memory including multiple one-time programmable memory cells constructed using according to the principles described herein.

FIG. 10 illustrates a block diagram of an integrated circuit 1000 with OTP memory 1002 including multiple OTP memory cells 1010, 1020, 1030, and 1040 constructed according to the principles described herein. OTP memory cell 1010 has a first input terminal for receiving a signal labeled "$ENABLE_0$ IN", a second input terminal for receiving a signal labeled "$BIT_0$ IN", a third input terminal for receiving a signal labeled "$V_{IREF}$", a fourth input terminal for receiving a signal labeled "$V_{REF}$", a first output terminal for providing a signal labeled "$BIT_0$ OUT", and a second output terminal for providing a signal labeled "$ENABLE_1$ IN". OTP memory cell 1020 has a first input terminal connected to the second output terminal of OTP memory cell 1010 for receiving the $ENABLE_1$ IN signal, a second input terminal for receiving a signal labeled "$BIT_1$ IN", a third input terminal for receiving a the $V_{IREF}$ signal, a fourth input terminal for receiving the $V_{REF}$ signal, a first output terminal for providing a signal labeled "$BIT_1$ OUT", and a second output terminal for providing a signal labeled "$ENABLE_2$ IN". OTP memory cell 1030 has a first input terminal connected to the second output terminal of OTP memory cell 1020 for receiving the $ENABLE_2$ IN signal, a second input terminal for receiving a signal labeled "$BIT_2$ IN", a third input terminal for receiving a the $V_{IREF}$ signal, a fourth input terminal for receiving the $V_{REF}$ signal, a first output terminal for providing a signal labeled "$BIT_2$ OUT", and a second output terminal for providing a signal labeled "$ENABLE_N$ IN". OTP memory cell 1040 has a first input terminal for receiving the $ENABLE_N$ IN signal, a second input terminal for receiving a signal labeled "BIT$_N$ IN", a third input terminal for receiving a the V$_{IREF}$ signal, a fourth input terminal for receiving the V$_{REF}$ signal, and a first output terminal for providing a signal labeled "BIT$_N$ OUT".

Integrated circuit 1000 is a monolithic circuit implemented in, for example, complementary metal-oxide-semiconductor (CMOS) fabrication technology. It includes OTP memory 1002 as part of a larger overall function such as a microcontroller (MCU). In the example of an MCU, OTP memory 1002 includes bits that are used to configure the MCU and correspond to programmable options available to the user. In the example of an MCU, integrated circuit 1000 would include other components of the MCU including a central processing unit core, integrated nonvolatile program memory, random access memory, peripherals such as timers, counters, and input-output interface circuits, and the like, which are not shown in FIG. 10. In addition, integrated circuit 1000 includes bonding pads for connection to integrated circuit pins such as through a lead frame. It should be apparent that a CMOS MCU is just one example and OTP memory 1002 may be used in a wide variety of integrated circuits and with a variety of manufacturing technologies.

In response to the activation of the ENABLE$_0$ IN signal, OTP memory cell 1010 selectively programs its fuse according to the BIT$_0$ IN signal. If the BIT$_0$ IN signal is high, OTP memory cell 1010 blows its fuse (not shown) using a substantially constant current generated by V$_{IREF}$. Once the voltage within the fuse drops below V$_{REF}$ or if the BIT$_0$ IN signal is low, OTP memory cell 1010 activates an ENABLE$_0$ OUT signal, which becomes the ENABLE$_1$ IN signal to OTP memory cell 1020. Once the voltage within the fuse drops below V$_{REF}$ or if the BIT$_1$ IN single is low, OTP memory cell 1020 activates an ENABLE$_1$ OUT signal, which becomes the ENABLE$_2$ IN signal to OTP memory cell 1030. Once the voltage within the fuse drops below V$_{REF}$ or if the BIT$_2$ IN single is low, OTP memory cell 1030 activates an ENABLE$_2$ OUT signal, which becomes the ENABLE$_3$ IN signal to a next OTP memory cell. Eventually, the ENABLE$_K$ IN signal is activated and OTP cell 1040 completes the programming of OTP memory 1002 if either voltage on the fuse drops below V$_{REF}$ or if the BIT$_K$ IN signal is low.

Although the present invention has been described with reference to preferred embodiments, workers skilled in the art will recognize that changes may be made in form and detail without departing from the scope of the invention.

What is claimed is:

1. A one-time programmable memory comprising:
    a first one-time programmable memory cell comprising cell comprising:
        a fuse core having an input terminal for receiving a trim signal, and an output terminal for providing a sense signal, wherein the fuse core has a fuse and conducts current through the fuse in response to the trim signal;
        a sense circuit having an input terminal coupled to the output terminal of the fuse core, and an output terminal for providing a termination signal in response to a transition in the sense signal; and
        a logic circuit having a first input terminal for receiving a program enable signal, a second input terminal for receiving a data signal, a third input terminal coupled to the output terminal of the sense circuit for receiving the termination signal, and an output terminal coupled to the input terminal of the fuse core for providing the trim signal, wherein the logic circuit activates the trim signal in response to an activation of the program enable signal if the data signal is in a first logic state, and subsequently deactivates the trim signal in response to an activation of the termination signal.

2. The one-time programmable memory of claim 1, wherein the logic circuit further comprises a second output terminal for activating a second program enable signal in response to either the data signal being in a second logic state or the activating of the termination signal.

3. The one-time programmable memory of claim 2, further comprising:
    a second one-time programmable memory cell having a program enable input terminal coupled to the second output terminal of the logic circuit.

4. The one-time programmable memory of claim 1, wherein the sense circuit comprises a sense amplifier having a first input terminal coupled to the output terminal of the fuse core, a second input terminal coupled to a reference voltage terminal, and an output terminal coupled to third input terminal of the logic circuit, wherein the sense circuit provides the termination signal in response to detecting that a fuse resistance reaches a predefined threshold.

5. The one-time programmable memory of claim 1, wherein the fuse core comprises:
    a switched current source for providing a substantially constant current, having a first current terminal coupled to the second terminal of the fuse, a second current terminal coupled to a second power supply voltage terminal, and a control terminal for receiving the trim signal; and
    the fuse having a first terminal coupled to a first power supply voltage terminal, and a second terminal.

6. The one-time programmable memory of claim 5, wherein the substantially constant current is greater than a predefined minimum and less than a predefined maximum.

7. The one-time programmable memory of claim 5, wherein the switched current source is characterized as providing a reference current that varies in response to process variations in substantially the same way that the fuse varies in response to the process variations.

8. The one-time programmable memory of claim 5, wherein the switched current source is characterized as providing a reference current that varies in response to changes in ambient programming temperature.

9. The one-time programmable memory of claim 5, wherein the switched current source is characterized as providing a reference current that varies in response to temperature variations.

10. The one-time programmable memory of claim 5, wherein the switched current source comprises:
    a reference current source for providing a first current to an output terminal thereof;
    a first transistor having a first current electrode coupled to the output terminal of the reference current source, a control electrode coupled to the first current electrode thereof, and a second current electrode coupled to the second power supply voltage terminal; and
    a second transistor having a first current electrode forming the first terminal of the switched current source, a control electrode coupled to the first current electrode of the first transistor, and a second current electrode forming the second current terminal of the switched current source.

11. The one-time programmable memory of claim 10, wherein the switched current source further comprises:
    a third transistor having first and second current electrodes coupled between the output terminal of the reference current source and the first current electrode of the first transistor, and a control electrode for receiving an enable signal; and a fourth transistor having a first current electrode coupled to the control electrode of the first and second transistors, a control electrode for receiving the enable signal, and a second current electrode coupled to the second power supply voltage terminal.

12. The one-time programmable memory of claim 10, wherein the switched current source further comprises:
a third transistor having first and second current electrodes coupled between the control electrode of the first transistor and the control electrode of the second transistor, and a control electrode for receiving an enable signal; and
a fourth transistor having a first current electrode coupled to the control electrode of the second transistor, a control electrode for receiving the enable signal, and a second current electrode coupled to the second power supply voltage terminal.

13. A one-time programmable memory comprising:
a first one-time programmable memory cell comprising cell comprising:
a fuse core having a fuse and a switched current source for driving a current through the fuse in response to a trim signal;
a sense circuit coupled to the fuse core for generating a termination signal in response to detecting that a fuse resistance reaches a predefined threshold; and
a logic circuit coupled to the sense circuit and the fuse core for activating the trim signal in response to receiving a program enable signal and a data signal in a first logic state and subsequently deactivating the trim signal in response to receiving the termination signal from the sense circuit.

14. The one-time programmable memory of claim 13, further comprising:
a second one-time programmable memory cell for programming a second fuse core in response to a second program enable signal and a second data signal being in the first logic state, wherein the logic circuit further provides the second program enable signal in response to either the data signal being in a second logic state or activating the termination signal.

15. The one-time programmable memory of claim 13, wherein the switched current source for driving the current through the fuse comprises a substantially constant current.

16. The one-time programmable memory of claim 13, wherein the switched current source is characterized as providing a reference current that varies in response to process variations in substantially the same way that characteristics of the fuse vary in response to the process variations.

17. The one-time programmable memory of claim 13, wherein the switched current source is characterized as providing a reference current that varies in response to changes in ambient programming temperature.

18. An integrated circuit including a one-time programmable memory, the one-time programmable memory comprising:
a first one-time programmable memory cell comprising a first auto-terminating program circuit having an input for receiving a first data signal and an output for providing an enable output signal, wherein the first auto-terminating program circuit provides the enable signal in response to a completion of the programming of the first one-time programmable memory cell; and a second one-time programmable memory cell comprising a second auto-terminating program circuit having an enable input coupled to the output of the first auto-terminating program circuit, and an input for receiving a second data signal, wherein the second auto-terminating program circuit selectively enables programming of the second one-time programmable memory cell based on the second data signal after an activation of the enable output signal.

19. The integrated circuit of claim 18, wherein the first auto-terminating program circuit provides the enable output signal further in response to the first data signal being in a first logic state.

20. The integrated circuit of claim 18, wherein the first auto-terminating program circuit further provides the enable output signal in response to either a failure of the programming of the first one-time programmable memory cell or the first data signal being in a first logic state.

21. The integrated circuit of claim 18, wherein the first and second one-time programmable memory cells each comprise a fuse, wherein the first and second auto-terminating program circuits each selectively program the fuse using a substantially constant current and according to a respective one of the first and second data signals.

22. The integrated circuit of claim 18, wherein:
the second auto-terminating program circuit further comprises an output for providing a second enable output signal in response to either a completion of programming the second one-time programmable memory cell or the second data signal being in a first logic state; and
the one-time programmable memory further comprises:
a third one-time programmable memory cell comprising
a third auto-terminating program circuit having an enable input coupled to the output of the second auto-terminating program circuit, and an input for receiving a third data signal, wherein the third auto-terminating program circuit selectively programs the third one-time programmable memory cell based on the third data signal after an activation of the second enable output signal.

23. The integrated circuit of claim 18, wherein the first auto-terminating program circuit terminates programming and provides the enable output signal in response to a completion of the programming of the first one-time programmable memory cell.

24. The integrated circuit of claim 18, wherein the first auto-terminating program circuit further comprises:
a fuse core having a fuse and a switched current source for driving a substantially constant current through the fuse in response to a trim signal;
a sense circuit coupled to the fuse core for generating the enable output signal in response to detecting that a fuse resistance reaches a predefined threshold; and
a logic circuit coupled to the fuse core for activating a trim signal in a first logic state in response to receiving the data signal in a first state and for deactivating the trim signal in a second logic state in response to receiving the enable output signal.

25. The integrated circuit of claim 24, wherein the substantially constant current is greater than a predefined minimum and less than a predefined maximum.

26. A method for programming a one-time programmable memory comprising:
driving programming current through a fuse of a first one-time programmable memory cell in response to a first data signal being in a first state;
sensing a resistance of the fuse;

terminating the driving when the resistance is greater than a threshold; and selectively programming a second one-time programmable memory cell based on a second data signal in response to the terminating.

27. The method of claim 26 wherein the driving comprises:

activating a trim signal in response to an enable input signal being active and the first data signal being in the first state;

in response to the activating the trim signal:
  switching a current through the fuse in response to the activating the trim signal;
  sensing a resistance of the fuse;
  activating a termination signal in response to the resistance of the fuse being above a threshold; and
  deactivating the trim signal in response to the activating the termination signal.

28. The method of claim 27, further comprising:

activating an enable output signal to an enable input terminal of the second one-time programmable memory cell in response to either the activating the termination signal, or both the enable input signal being active and the first data signal being in a second state.

29. The method of claim 28, wherein the selectively programming the second one-time programmable memory cell comprises:

driving programming current through a fuse of a second one-time programmable memory cell in response to the second data signal being in the first state;

sensing a resistance of the fuse; and terminating the driving when the resistance is greater than the threshold.

\* \* \* \* \*

UNITED STATES PATENT AND TRADEMARK OFFICE
CERTIFICATE OF CORRECTION

PATENT NO. : 8,964,444 B2
APPLICATION NO. : 13/455723
DATED : February 24, 2015
INVENTOR(S) : Jefferson W. Hall et al.

Page 1 of 1

It is certified that error appears in the above-identified patent and that said Letters Patent is hereby corrected as shown below:

In the Specification:

In column 12, line 65, replace "$ENABLE_N$ IN" with "$ENABLE_3$ IN".

In the Claims:

Column 13, lines 49-50, in claim 1, replace "cell comprising cell comprising:" with "cell comprising:".

Column 15, lines 23-24, in claim 13, replace "cell comprising cell comprising:" with "cell comprising:".

Signed and Sealed this
First Day of December, 2015

Michelle K. Lee
*Director of the United States Patent and Trademark Office*